United States Patent
Bailey et al.

(10) Patent No.: US 6,438,722 B1
(45) Date of Patent: *Aug. 20, 2002

(54) METHOD AND SYSTEM FOR TESTING AN INTEGRATED CIRCUIT

(75) Inventors: Roger Ned Bailey, Austin; Michael Stephen Floyd, Leander; Bradley McCredie; Kevin Franklin Reick, both of Austin; Hugh Rodney Stigdon, Georgetown; Jennifer Lane Vargus, Cedar Park, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/372,697

(22) Filed: Aug. 11, 1999

(51) Int. Cl.[7] ........................... G01R 31/28; G06F 11/00
(52) U.S. Cl. ........................................ 714/736; 714/738
(58) Field of Search ................................ 714/738, 739, 714/735, 724, 736

(56) References Cited

U.S. PATENT DOCUMENTS 5,170,398 A * 12/1992 Fujueda et al. ............. 714/738
5,758,120 A * 5/1998 Kahle et al. ................. 395/477
6,182,258 B1 * 1/2001 Hollander .................... 714/739

* cited by examiner

Primary Examiner—Phung M. Chung
(74) Attorney, Agent, or Firm—Anthony V. S. England; Bracewell & Patterson, L.L.P.

(57) ABSTRACT

The foregoing objects are achieved as is now described. A method and system for testing an integrated circuit are provided. A test substrate is provided which is manufactured by the same particular production technology for which the complex integrated circuit is designed. A pattern generator for generating test data and a result checker for comparing output data are embedded on the test substrate. Isolated portions of circuitry of the integrated circuit are selectively embedded onto the test substrate. The isolated portions of circuitry are subjected to testing by applying test data from the pattern generator to the isolated portions of circuitry. Errors in the isolated portions of circuitry are detected with the result checker by comparing data output from the isolated portions of circuitry with predetermined expected data, such that the integrated circuit is tested by susets, independently of testing the integrated circuit in its entirety.

17 Claims, 6 Drawing Sheets

METHOD AND SYSTEM FOR TESTING AN INTEGRATED CIRCUIT

BACKGROUND OF THE INVENTION

1. Technical Field

The present invention relates in general to an improved method and system for testing an integrated circuit and more particularly to a test chip for testing a complex integrated circuit. Still more particularly, the present invention relates to a method and system for detecting errors in a subset of the complex integrated circuit which is embedded within a test chip, independent of the complex integrated circuit.

2. Description of the Related Art

As integrated circuit technology has advanced, the complexity and density of circuit devices formed within a single chip has increased dramatically. Consequently, several problems have arisen with regard to testing proper operation of such integrated circuits. For example, while the methodology for testing an integrated circuit (IC) may be relatively straight forward, most IC chips typically have far fewer I/O pins available to a circuit tester than are required to adequately test the IC and at the same time maintain the cost and functionality thereof. In addition, most high end commercial testers can not provide a large number of I/Os at speed to adequately test the design.

A general solution to the above-described problem is to embed a majority of the test circuitry on the chip itself rather relying solely on an external testing mechanism. Such testing facilities are frequently referred to as built-in self-test(BIST), array self-test(AST), array built-in self-test (ABIST), or logical built-in self-test(LBIST) circuits and will hereinafter be referred to generically as BIST circuits. BIST circuits are typically controlled by an external tester which provides a clock signal, scans test data in and scans results out of the BIST circuit. In general, a BIST circuit applies the received test data to functional units within an integrated circuit in which the BIST circuit is embedded and then compares the data output therefrom with expected data. In addition the data output from the functional units during testing is scanned out to a memory array within the external tester. In response to a discrepancy between the output data and the expected data, the BIST circuit indicates that a failure has been detected and after a delay, the application of data is halted and eventually the cycle during which the failure occurred is detected from data which is scanned out. Thereafter, the BIST circuit is re-run to the cycle in which the failure occurred. The state machine data at the failing cycle is then scanned out and utilized to generate a bit-fail map for use in failure analysis.

A general shortcoming of the BIST testing methodology is the inability of the cycle of failure to be precisely detected at typical operating speeds of fast memories (e.g. greater than 200 MHz) because of the latency of data transmittal between the BIST circuit and the external tester. In order to properly detect the cycle of failure after the BIST is halted, complex algorithms are typically employed which may take many hours or even days to determine the cycle of failure. Further complicating this shortcoming is the increase in the volume of data which is processed in a period of time as IC speeds increase (e.g. greater than 1 GHz). In testing complex integrated circuits, and in particular in testing processors, it is desirable to determine faults as quickly as possible in order to decrease time to develop faster processor speeds.

Further, no commercial external tester is available which can provide data patterns to a BIST circuit of an AIC at speed for frequency ranges such as 1 GHz or greater and with a large number of channels (i.e. greater than 640 channels). Thereby, even though the operational frequency of the chip may be 1 GHz, during testing, the frequency of operation would be limited by the latency of transfer between the external tester and the IC. In addition, specialized I/O circuits which could communicate with the external tester to send and receive signals at this high rate of frequency would be necessary in an IC, adding circuit complexity to the IC for testing purposes. Further limiting the testing of an IC, a BIST circuit cannot test data over continuous functional clock cycles because a pattern must be scanned in, a few functional clock cycles issued, and a result scanned out.

Importantly, in adding BIST circuitry to an IC, the complexity of BIST testing circuitry must be balanced with the functional circuitry of the IC. However, in designing for increased processor speeds, such as 1 GHz or greater, the volume of processor operations which can be performed per cycle is increased, thereby increasing the complexity of circuitry and the number of data paths within the functional units of the IC which need to be checked for errors. Thereby, the width of test data vectors needed to properly test the functionality of such a processor is expanded to such a point that testing the processor with a BIST test would add an undesirable amount of circuitry. In addition, supplying a wider test vector from the external tester to the IC would further add to the latency of transmittal between external tester and IC.

In addition, BIST circuits do not have the advantage of providing test data subject to environmental conditions present within an integrated circuit such as noise, temperature, frequency limitations, etc. In particular, when designing for increased processor speeds such as 1 GHz or greater, these environmental conditions are expected to be magnified in comparison to slower processor speeds.

Therefore, as production technologies are improving to provide for the manufacture of ICs which operate at very high frequencies, testing technology utilized to test these faster chip is needed. As should thus be apparent, an improved method for testing a complex integrated circuit is needed such that a cycle of failure may be detected in a timely manner, the width of test data vectors may be expanded in order to properly test the functionality of the complex integrated circuit, test data vectors may be provided and the results detected at speed, and conditions of operation such as environmental conditions and operation over a range of frequencies may be tested.

SUMMARY OF THE INVENTION

It is therefore one object of the present invention to provide an improved method and system for testing an integrated circuit.

It is another object of the present invention to provide a test chip for testing an integrated circuit.

It is yet object of the present invention to provide a method and system for detecting errors in an integrated circuit by subsets which are embedded within a test chip, independently of testing the integrated circuit in its entirety.

The foregoing objects are achieved as is now described. A method and system for testing an integrated circuit designed for manufacture by a particular production technology are provided. A test substrate is provided which is manufactured by the same particular production technology for which the complex integrated circuit is designed. A pattern generator for generating test data and a result checker for comparing output data are embedded on the test substrate. Isolated portions of circuitry of the integrated circuit are selectively embedded onto the test substrate. The isolated portions of circuitry are subjected to testing by applying test data from the pattern generator to the isolated portions of circuitry. Errors in the isolated portions of circuitry are detected with the result checker by comparing data output from the isolated portions of circuitry with predetermined expected data, such that the integrated circuit is tested by subsets, independently of testing the entire integrated circuit.

It is an advantage of the method and system that the design process of the complex integrated circuit proceeds with efficiency by correcting errors found in the subset thereof.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
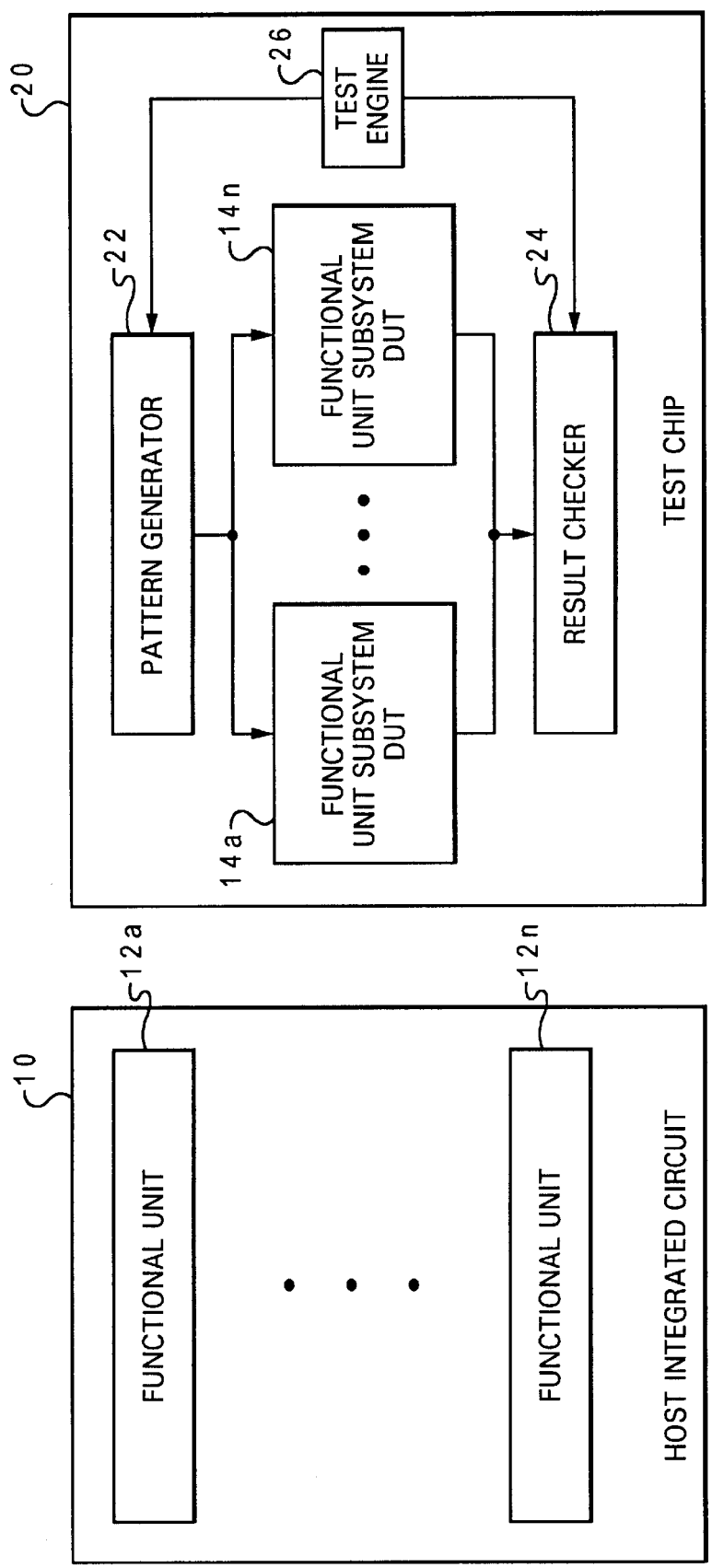
FIG. 1 illustrates a block diagram representation of a host integrated circuit and a test chip thereof.

With reference now to the figures and in particular with reference to FIG. 1, there is depicted a block diagram representation of a host integrated circuit (IC) 10 and a test chip 20. Host IC 10 includes multiple functional units 12a–12n embedded within host IC 10 as is well known in the art. Typically, functional units 12a–12n are interconnected by a bus system (not shown) as needed for operation, supplied appropriate power (not shown) and synchronized in operation by a clock signal provided by a clock controller 11. In addition, although not depicted, a particular production technology of the many available production technologies known in the art for manufacturing complex integrated circuits is employed for the manufacture of host IC 10. In particular, the particular production technology utilized may determine the effective speed at which a host IC 10 may be clocked to properly function. More particularly, with the advancement of production technologies and materials used therein, such as copper interconnects, the effective speed at which host IC 10 may be clocked and function properly may be increased. However, other factors such as operating noise, temperature and frequency limitations may hinder the operation of a host IC 10. Often, therefore, functional units may be designed for a particular production technology, operating environment and frequency of operation, however actual frequency of operation cannot be truly known until the functional units are produced by the particular production technology and run within the actual operating environment.

Referring still to FIG. 1, a test chip 20 is depicted which includes multiple functional unit subsystem device under tests (DUTs) 14a–14n embedded within a test substrate. Each functional unit subsystem DUT is preferably an isolated portion of the circuitry from functional units 12a–12n of host IC 10 whereby test chip 20 includes a functional subsystem of host IC 10, independent in operation from host IC 10. Also embedded on test chip 20 are a pattern generator 22, a result checker 24, and a test engine 26 which comprise a testing infrastructure for DUTS 14a–14n. Pattern generator 22 includes multiple test patterns which are provided to each functional unit subsystem DUTs 14a–14n. Result checker 24 receives the data output from functional unit subsystem DUTs 14a–14n and checks the results against expected data therewithin to detect errors. Test engine 26 controls the coordination of data between pattern generator 22 and result checker 24 such as the sequencing of patterns of data provided to DUTs 14a–14n by pattern generator 22 and the sequencing of patterns of data to be compared in result checker 24. Preferably, test engine 26 is a programmable state machine which may be reset by an external control signal and includes a run function, stop on error function and looping ability.

Preferably, test chip 20 is manufactured with the same production technology for which host IC 10 is designed, whereby the actual operating frequency of host IC 10 may be tested. In addition, by including sequences of data patterns and control thereof on test chip 20, data may be supplied to the function unit subsystem DUTs 14a–14n at speed. Further, preferably the testing circuitry of test chip 20 is heavily pipelined and thereby may run at a significantly higher operating frequency than the expected operating frequency of any DUTs 14a–14n. By operating the testing circuitry of test chip 20 at a higher operating frequency, the full potential speed of DUTs 14a–14n may be tested for prior to any failure in the testing circuitry due to operating frequency constraints.

Further, test chip 20 includes additional environmental components (not shown) which when test chip 20 is in operation, emulate the noise and temperature conditions expected within host IC 10. Thereby, in designing a product such as host IC 10 which is a highly complex integrated circuit, a less expensive and complex version thereof may be tested as test chip 20. In addition, the complexity of testing circuitry within host IC 10 may be effectively reduced by placing complex testing circuitry on test chip 20 in order to test data vectors which are as wide as needed with the expected production technology and operating conditions, thereby freeing circuitry within host IC 10 for additional functional units.

Figure 2:
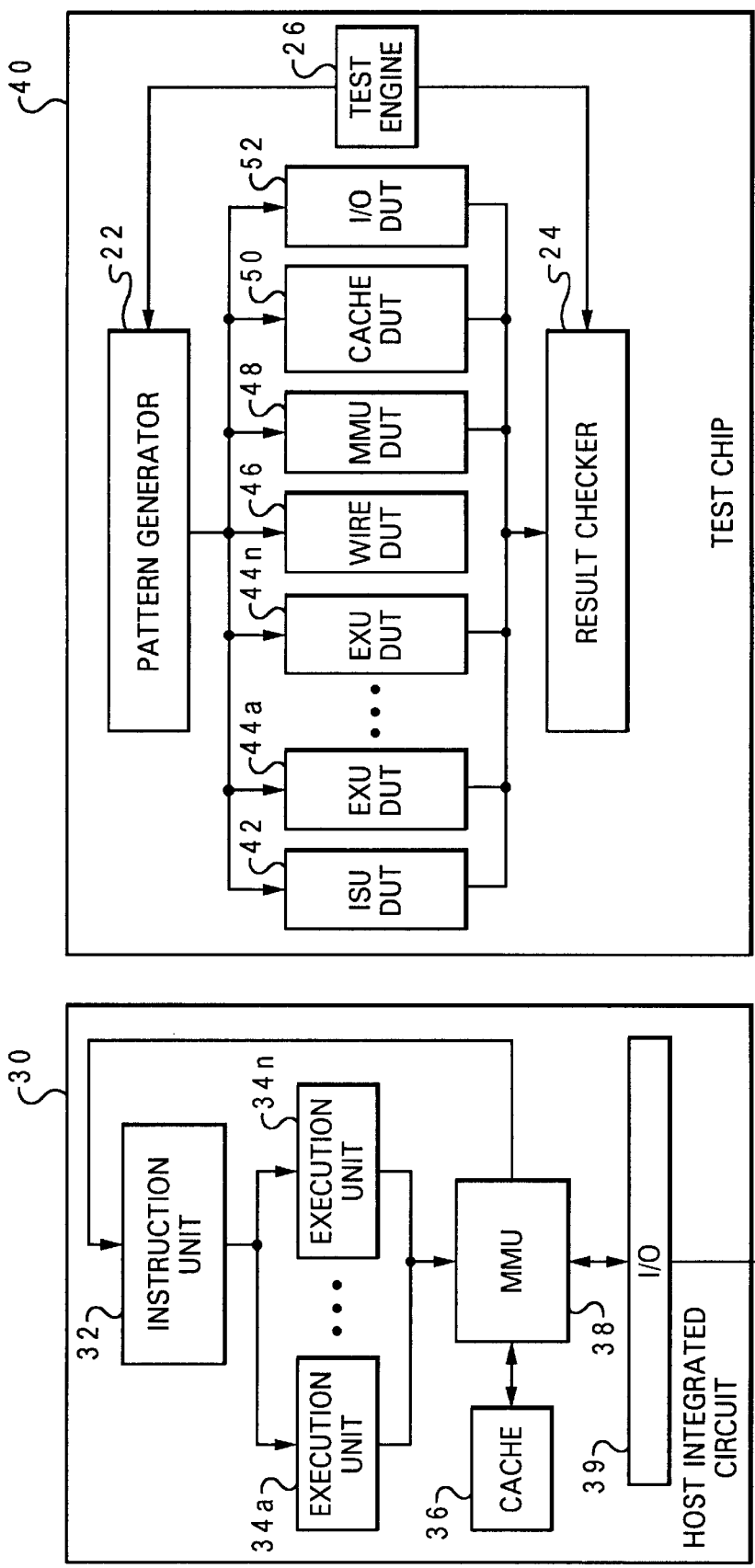
FIG. 2 depicts a block diagram representation of a host integrated circuit and a test chip thereof, wherein the host integrated circuit is a central processing unit.

With reference now to FIG. 2, there is depicted a block diagram representation of a host integrated circuit (IC) 30 and a test chip 40 wherein host IC 30 is a central processing unit(CPU). Host IC 30 preferably includes functional units which are specified for providing data processing functions such as fetching, decoding and executing instructions and transferring data to and from other resources over a system bus 37. While one embodiment of a CPU architecture with typical functional units is depicted, additional CPU architectures may also be utilized as will be apparent to one skilled in the art.

In particular, for host IC 30 depicted, data is fetched from system bus 37, through an I/O controller 39 and memory management unit (MMU) 38, into an instruction fetching unit within instruction unit (ISU) 32. Instruction unit 32 decodes fetched instructions, generates instruction addresses for the instructions, sequences the decoded instructions and passes the decoded instructions to the appropriate execution unit of execution units (EXUs) 34*a*–34*n*. Preferably, each of execution units 34*a*–34*n* is specified to execute particular types of instructions and may generate addresses for data accesses in doing so. For example, at least one integer unit (IU), floating-point unit (FPU), load/store unit (LSU), and branch processing unit (BPU) may be included in addition to other execution units which are well known in the art. MMU 38 preferably searches for data in a cache memory 36, and thereafter in other memory units along system bus 37. Cache 36 may include multiple memory units such as level one(L1) cache, level two (L2) cache, static access random-access memory (SRAM) and content addressable memory (CAM).

Referring still to FIG. 2, a test chip 40 for host IC 30 is depicted. As described with reference to FIG. 1, a pattern generator 22, result checker 24 and test engine 26 are embedded on test chip 40 for performing testing of multiple DUTs. Test chip 40 depicts embedded DUTs which are isolated portions of the specified functional units within host IC 30. For example, ISU DUT 42 includes isolated portions of instruction unit 32, EXU DUTs 44*a*–44*n* include isolated portions of execution units 34*a*–34*n*, MMU DUT 48 includes isolated portions of MMU 38, cache DUT 50 includes isolate portions of each of the memory units within cache 36, and I/O DUT includes isolated portions of I/O controller 39. In addition, a Wire DUT 46 is depicted which preferably includes a wide bus for passing the entire data vector from pattern generator 22 or a portion thereof in order to test the infrastructure circuitry. In particular, the effects of noise on wide buses within a host IC is desirable to detect. While the DUTs which are depicted may be utilized to test a subsystem of host IC 30, additional DUTs may be embedded within test chip 40 from host IC 30 and/or DUTs which are depicted may be further implemented as multiple DUTs. For example, cache DUT 50 may be implemented as a L1 DUT, L2 DUT and SLB DUT where each of these DUTs respectively includes isolated portions of the L1 cache, L2 cache and SLB DUT of cache 36.

It is preferable that the test circuitry which includes pattern generator 22, test engine 26 and result checker 24 is designed and manufactured such that the operating speed of the test circuitry is significantly larger than the expected operating speed of any of the DUTs. For example, the test circuitry may run at 1.5 GHz while ISU DUT 42 runs at 1 GHz and Cache DUT 50 runs at 1.1 GHz. By running enabling the test circuitry to run at operating speeds larger than those of the DUTs, it is ensured that the breaking point for the DUTs will be achieved prior to the breaking point for the test circuitry.

Figure 3:
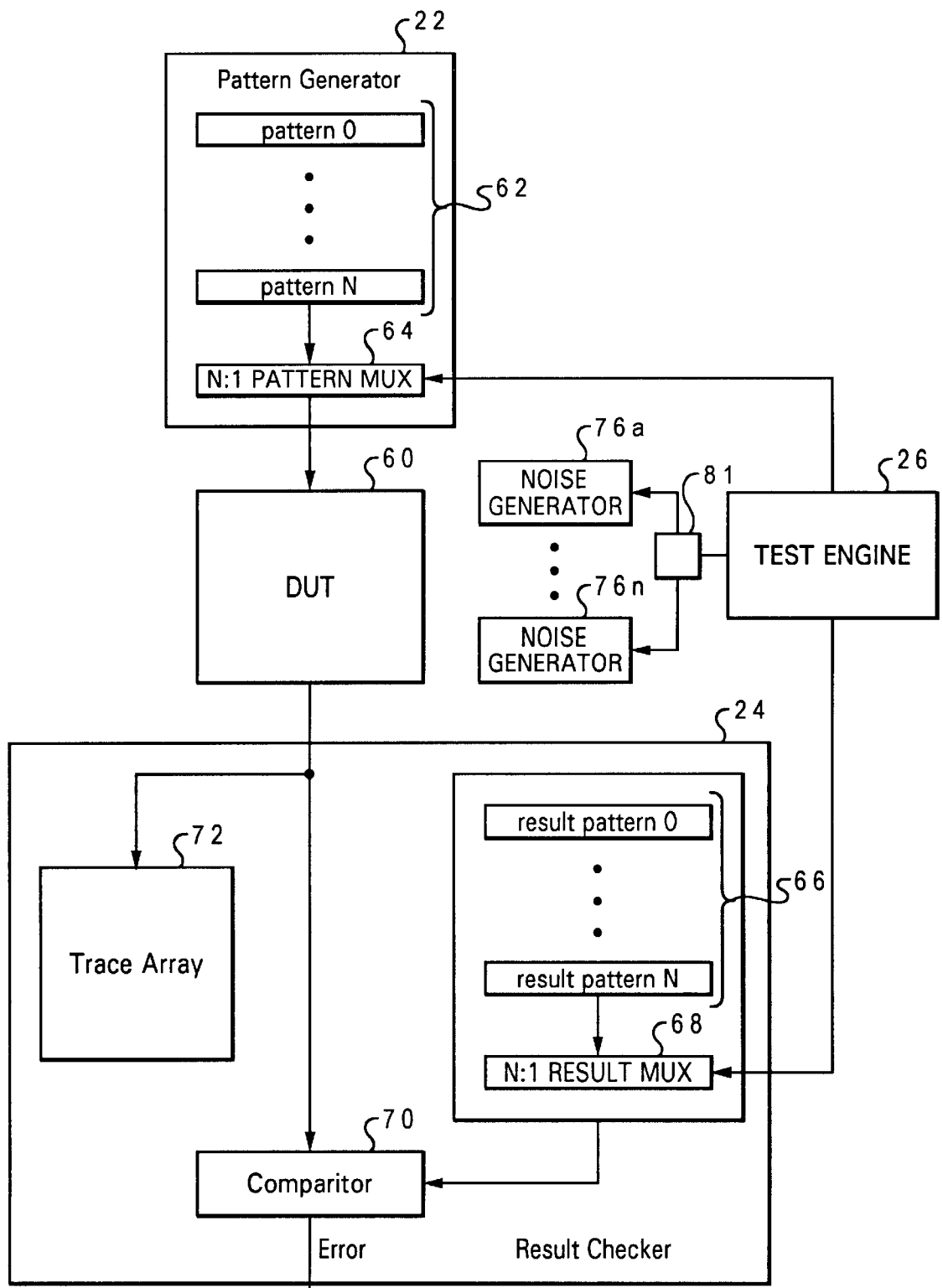
FIG. 3 illustrates a more detailed block diagram of a pattern generator and result checker within a test chip.

With reference now to FIG. 3, there is depicted a more detailed block diagram of a pattern generator and result checker within a test chip. As depicted in FIGS. 1 and 2, a test chip includes pattern generator 22, result checker 24, test engine 26 and at least one DUT 60 which is a subset of a functional unit within a host IC. In subjecting DUT 60 to testing, a data vector or data pattern is output from pattern generator 22 which is preferably the width of the data inputs to DUT 60. Preferably, a unique data pattern of the specified width is stored within each of multiple pattern data registers 62 within pattern generator 22. Each of the registers may be individually selected as input to DUT 60 as directed by a pattern multiplexer (MUX) 64. Pattern MUX 64 is controlled by test engine 26 which provides a signal indicating the selection of a register of multiple pattern data registers 62. In the present embodiment, test engine 26 is a fully programmable state machine capable of selecting infinite sequences of patterns including looping through patterns and repeating patterns. In addition, delays may be programmed into test engine 26 such that a delay period is waited upon prior to selection of data patterns.

Mirroring multiple pattern data registers 62 are multiple result data registers 66 within result checker 24. Each of multiple result data registers 66 contains an expected data pattern of the specified width. As data is output from DUT 60, the output data pattern is compared with an expected data pattern by comparitor 70. Test engine 26 designates an expected data pattern through a signal to a result MUX 68 indicating the selection of a register of multiple result data registers 66. In comparing the output data pattern with the expected data pattern, if the two patterns do not match, comparitor 70 outputs an error signal. When an error signal is indicated, preferably the clock controller is stopped such that test engine 26 is halted and the cause of the error may be determined. As indicated, tests may be designed within test engine 26 that loop on a particular set of data patterns within pattern generator 22 such that the testing patterns may loop while other environmental conditions are dynamically changed until the test fails. For example, test engine 26 may control a noise controller 81 which provides noise control signals to multiple noise generators 76*a*–76*n* which are preferably clustered about each DUT 60 in order to emulate the noise generated within a host IC 30 as will be further described in FIG. 4. As a data pattern test sequence loops, the noise generators may be controlled to provide increased noise until a breaking point is reached and the test fails. In addition, environment conditions such as voltage or temperature may also be dynamically changed during a testing pattern loop until the test fails. In addition, by looping a test pattern and leaving the loop running for an extended period time without dynamically changing environmental conditions, DUT 60 may be tested for stability and reliability over extended periods of time.

Further, each data pattern output from DUT 60 is stored in a deep trace array 72 such that when an error occurs, data within trace array 72 may be utilized for debugging circuits and patterns through tracing functions which are well known in the art. The front end of trace array 72 is preferably a multi-state logic analyzer with the ability to trigger based on specific data patterns or changes in data patterns and the ability to control the flow of data when test engine 26 starts or stops. Particularly important, trace array 72 runs at speed on the test chip, therefore data may easily be stored therein with minimal latency.

Figure 4:
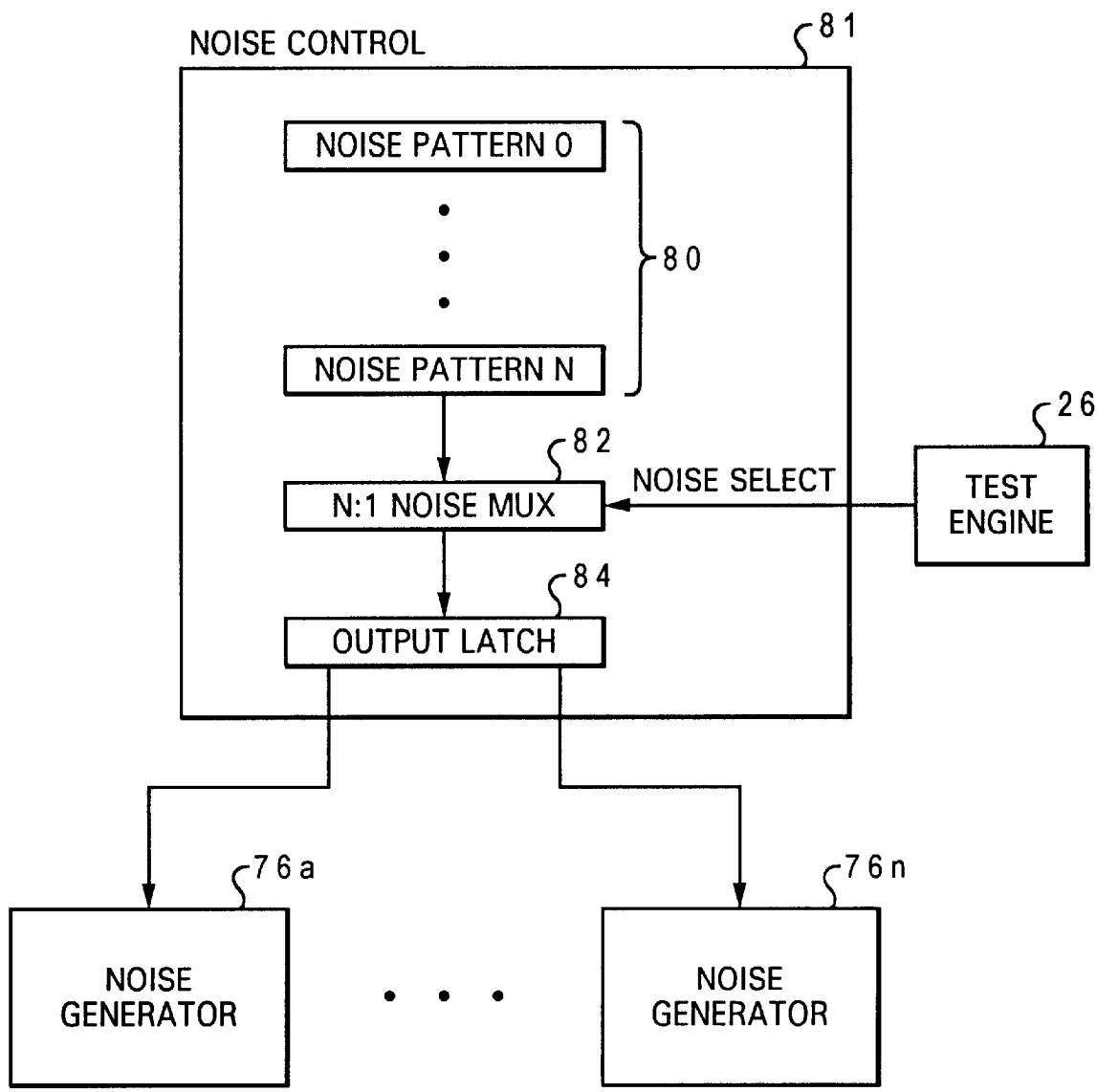
FIG. 4 depicts a block diagram representation of a noise generator controller.

Referring now to FIG. 4, there is illustrated a block diagram representation of a noise generator controller. It is preferable that a test chip does not contain all of the circuitry of the host integrated circuit from which DUTs are taken. However, in a reduced format, the test chip most likely will not generate all the power consumption, heat and noise signatures that are present in the host integrated circuit. Thereby, to model the operating environment of a high-speed complex integrated circuit, test engine 26 may control a noise controller 81 which provides noise pattern signals to multiple noise generators 76*a*–76*n* which surround each DUT. Noise generators 76*a*–76*n* are preferably included to precisely emulate the power consumption of complex integrated circuits, including the broad band current transients that complex integrated circuits often create. In addition, preferably each of noise generators 76a–76n is individually programmable with multiple sequences of noise patterns. In the present embodiment, the multiple sequences of noise patterns are stored as noise patterns O–N in registers 80. In each of the sequences, the magnitude (for example, 1X, 2X, 3X), type (for example, static or dynamic), and delta time (for example, periods of noise spikes and calm) may be specified in addition to other noise classification characteristics. Further, noise generators 76a–76n switch at the operating frequency of the test chip, whereby extreme noise conditions may be produced if desired for testing. In alternate embodiments, a testing sequence of noise patterns may be generated utilizing a PRPG.

The particular noise pattern of noise pattern registers 80 is selected by a noise select signal from test engine 26. The noise select signal is utilized by N:1 Noise MUX 82 to designate one of the noise patterns registers 80 for output. The selected noise pattern is placed in output latch 84 and distributed to multiple noise generators 76a–76n at the appropriate cycle. In particular, a noise pattern includes a multi-bit segment of data designated for each noise generator 76a–76n such that each of noise generators 76a–76n may be uniquely controlled.

Figure 5:
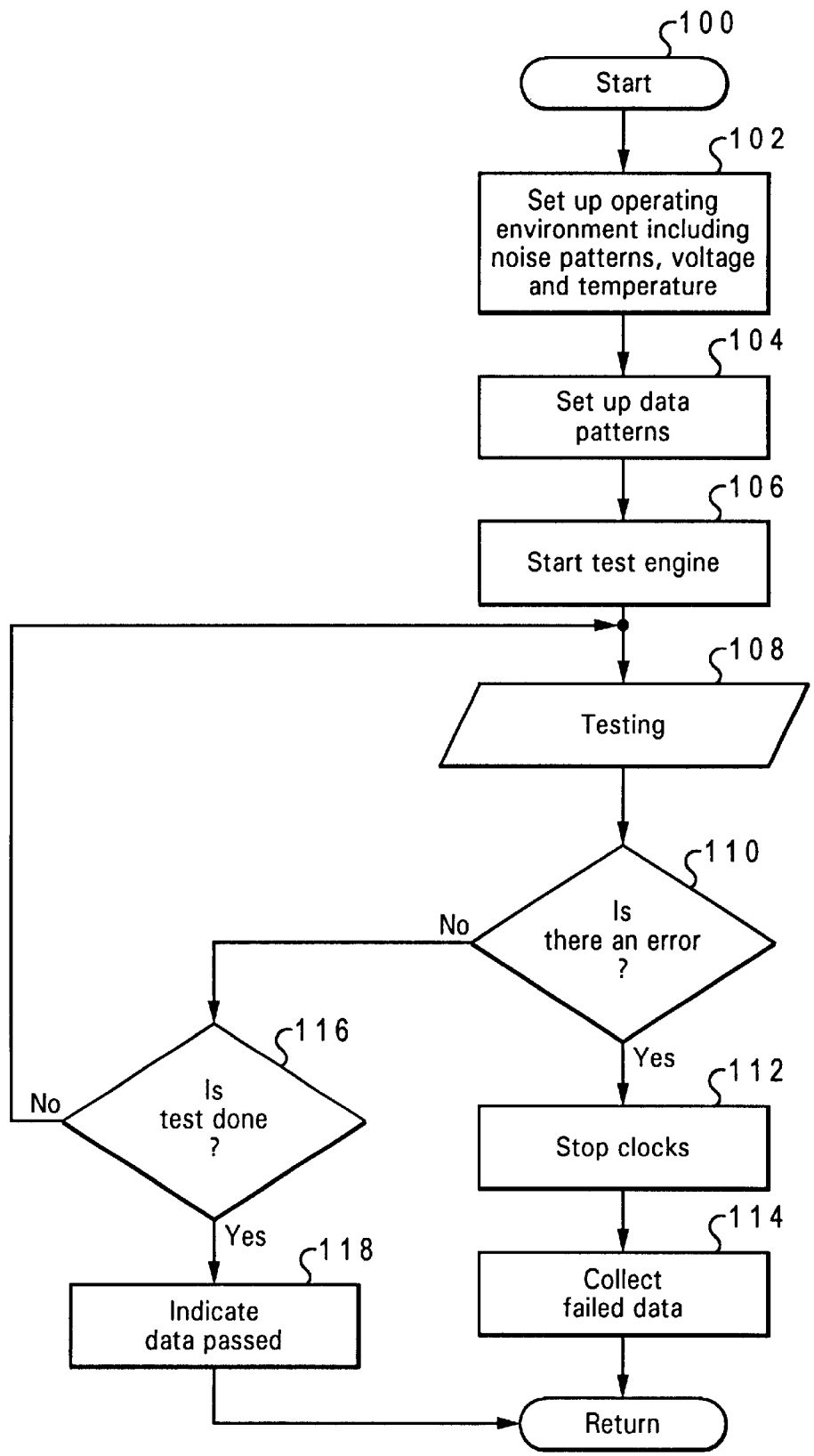
FIG. 5 illustrates a high level logic diagram illustrating a process for testing for errors within a test chip where a particular sequence of data patterns is selected, without looping.

With reference now to FIG. 5, there is depicted a high level logic diagram illustrating a process for testing for errors within a test chip where a particular sequence of data patterns is selected, without looping. As depicted, the process starts at block 100 and thereafter proceeds to block 102. Block 102 illustrates setting up an operating environment including noise patterns, voltage and temperature. Next, block 104 depicts setting up data patterns in the test engine. Thereafter, block 106 illustrates starting the test engine. By starting the test engine, as previously described, outputs to multiple MUXs are provided in order to select a data pattern. In addition, other outputs may be provided such as a clock speed control signal. In particular, a delay may be set up with the data patterns which stalls the selection of data patterns until the set delay time has expired. Next, block 108 depicts the test chip operating in the testing phase where the test engine controls the sequencing of data tests within the test chip. Thereafter, block 110 illustrates a determination of whether there is an error during testing. If there is an error, the process passes to block 112. Block 112 depicts stopping the clocks. Thereafter, block 114 illustrates collecting failed data whereafter the process returns.

Returning to block 110, if there is not an error detected, the process passes to block 116. Block 116 depicts a determination of whether the test is done. A particular sequence of data testing patterns is determined in the step at block 104. If the test is not done, the process passes to block 108 and continues testing. If the test is done, the process passes to block 118. Block 118 illustrates an indication that the test passed whereafter the process returns.

Figure 6:
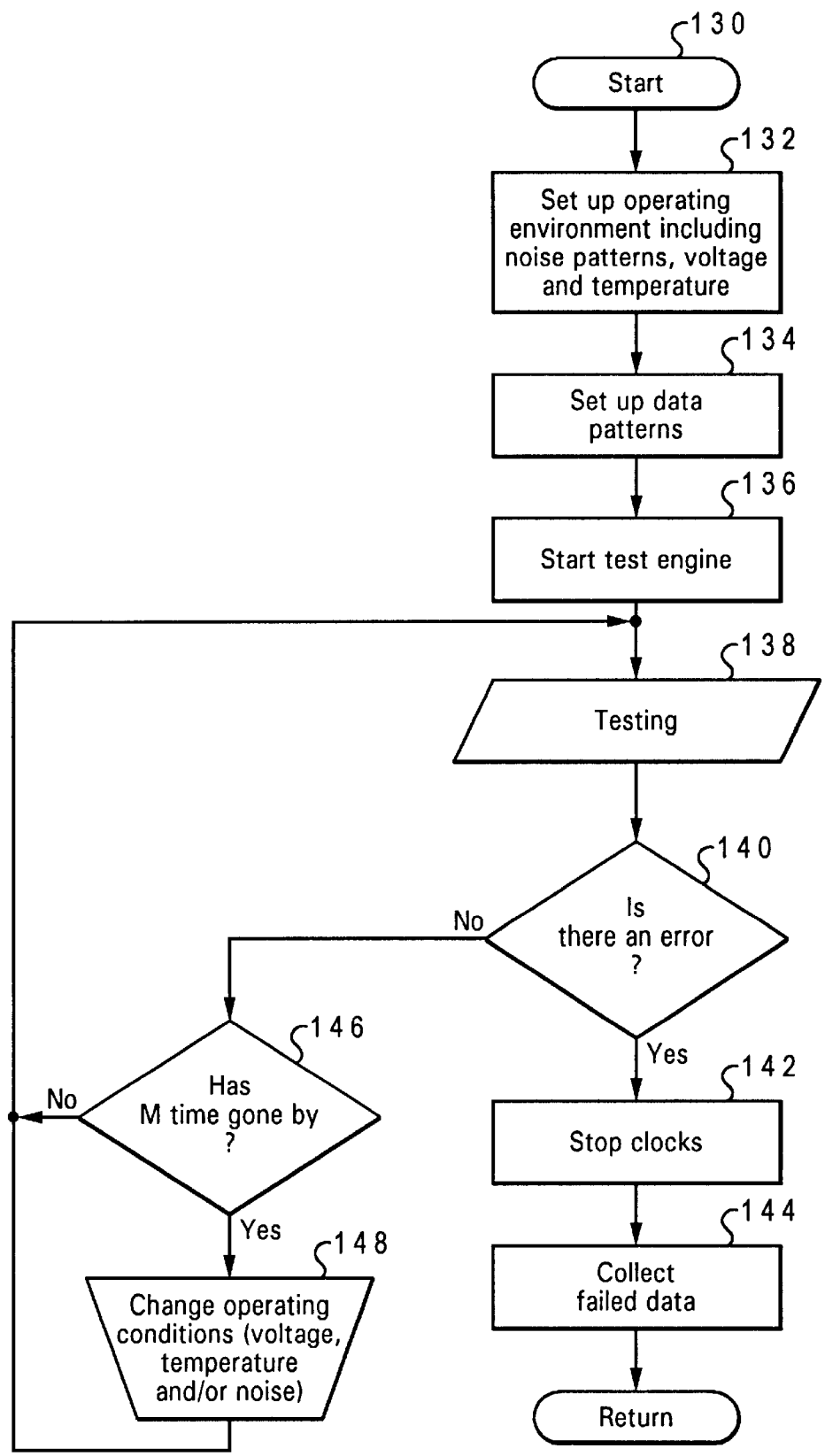
FIG. 6 depicts a high level logic diagram illustrating a process for testing for errors within a test chip where a particular sequence of data patterns is selected for looping.

Referring now to FIG. 6, there is illustrated a high level logic diagram illustrating a process for testing for errors within a test chip where a particular sequence of data patterns is selected for looping. As depicted, the process starts at block 130 and thereafter proceeds to block 132. Block 132 illustrates setting up an operating environment including noise patterns, voltage and temperature. Next, block 134 depicts setting up data patterns in the test engine. In particular, for the process depicted, a looping sequence of data patterns with a particular M time for stability is set up. Thereafter, block 136 illustrates starting the test engine. By starting the test engine, as previously described, outputs to multiple MUXs are provided in order to select a data pattern. In addition, other outputs may be provided such as a clock speed control signal. In particular, a delay may be set up with the data patterns which stalls the selection of data patterns until the set delay time has expired. Next, block 138 depicts the test chip operating in the testing phase where the test engine controls the sequencing of data tests within the test chip. Thereafter, block 140 illustrates a determination of whether there is an error during testing. If there is an error, the process passes to block 142. Block 142 depicts stopping the clocks. Thereafter, block 144 illustrates collecting failed data whereafter the process returns.

Returning to block 140, if there is not an error detected, the process passes to block 146. Block 146 depicts a determination of whether M time has gone by where M is a predetermined amount of time loaded with the test data looping sequence. If M time has not gone by, the process passes to block 148 and continues testing. If M time has gone by, the process passes to block 148. Block 148 illustrates a manual operation to change the operating environment such as voltage, temperature and noise. By providing for manual change of the operating environment during a looping test sequence, a particular set of test data can be re-run while operating environment are stressed until a breaking point is reached in a DUT such that an error may be detected. Preferably, M is chosen such that the test pattern loops a sufficient number of times to stabilize prior to changes in the operating environment.

While the invention has been particularly shown and described with reference now a preferred embodiment, it will be understood by those skilled in the art that various changes in form and detail may be made therein without departing from the spirit and scope of the invention.

What is claimed is:

1. A method for testing an integrated circuit, said method comprising the steps of:

providing a test substrate which is manufactured by a same particular production technology for which said integrated circuit is designed;

embedding a pattern generator for generating test data and a result checker for comparing output data on said test substrate;

selectively embedding isolated portions of circuitry of said integrated circuit onto said test substrate;

subjecting said isolated portions of circuitry to testing by applying test data from said pattern generator to said isolated portions of circuitry;

detecting errors in said isolated portions of circuitry with said result checker by comparing data output from said isolated portions of circuitry with predetermined expected data, such that said integrated circuit is tested by subsets, independent of testing said integrated circuit in its entirety.

2. The method for testing an integrated circuit according to claim 1, said step of subjecting said isolated portions of circuitry to testing by applying test data from said pattern generator to said isolated portions of circuitry further comprising the step of:

selecting a predetermined test data pattern from a plurality of predetermined test data patterns.

3. The method for testing an integrated circuit according to claim 1, said step of detecting errors in said isolated portions of circuitry with said result checker by comparing data output from said isolated portions of circuitry with predetermined expected data further comprising the step of:

selecting a predetermined data result from a plurality of predetermined expected data results.

4. The method for testing an integrated circuit according to claim 1, said method further comprising the step of:
applying expected environmental operating conditions to said isolated portions of circuitry.

5. The method for testing an integrated circuit according to claim 1, said method further comprising the step of:
collecting data output from said isolated portions of circuitry, wherein said data is utilized for error correction.

6. A method for testing an integrated circuit, said method comprising the steps of:
providing a test substrate which is manufactured by a same particular production technology for which said integrated circuit is designed;
embedding a pattern generator for generating test data, a result checker for comparing output data, and a environment controller for producing expected environmental operating conditions on said test substrate;
selectively embedding isolated portions of circuitry of said integrated circuit onto said test substrate;
applying said expected environmental operating conditions to said isolated portions of circuitry;
subjecting said isolated portions of circuitry to testing by applying test data from said pattern generator to said isolated portions of circuitry;
detecting errors in said isolated portions of circuitry with said result checker by comparing data output from said isolated portions of circuitry with predetermined expected data, such that said integrated circuit is tested by subsets, under a plurality of expected operating conditions independent of testing said integrated circuit inits entirety.

7. The method for testing an integrated circuit according to claim 6, said step of applying said expected environmental operating conditions to said isolated portions of circuitry further comprising the step of:
controlling a plurality of noise generators, wherein said plurality of noise generators are controllable to emulate noise expected in said integrated circuit over a range of operating conditions.

8. A test chip for testing an integrated circuit, said test chip comprising:
a test substrate;
means for manufacturing said test substrate by the same production technology by which an integrated circuit is designed to be manufactured;
isolated portions of circuitry of said integrated circuit selectively embedded on said test substrate;
a pattern generator embedded on said test substrate for subjecting said isolated portions of circuitry to testing by the application of test data thereto;
a result checker embedded on said test substrate for detecting errors in said isolated portions of circuitry by comparing data output from said isolated portions of circuitry with predetermined expected data, such that said integrated circuit is tested by subsets, independently of testing said integrated circuit in its entirety.

9. The test chip for testing an integrated circuit according to claim 8, wherein said isolated portions of circuitry comprise a plurality of devices under test.

10. The test chip for testing an integrated circuit according to claim 8, said pattern generator further comprising:
means for selecting a predetermined test data pattern from a plurality of predetermined test data patterns.

11. The test chip for testing an integrated circuit according to claim 8, said result checker further comprising:
means for selecting a predetermined data result from a plurality of predetermined expected data results.

12. The test chip for testing an integrated circuit according to claim 8, said test chip further comprising:
means for applying expected environmental operating conditions to said isolated portions of circuitry.

13. The test chip for testing an integrated circuit according to claim 12, said means for applying expected environmental operating conditions to said isolated portions of circuitry further comprising:
a plurality of noise generators, wherein said plurality of noise generators are controllable to emulate noise expected in said integrated circuit over a range of operating conditions.

14. The test chip for testing an integrated circuit according to claim 8, said test chip further comprising:
a trace array for collecting any data output from said isolated portions of circuitry, wherein said data is utilized for error correction.

15. The test chip for testing an integrated circuit according to claim 8, said test chip further comprising:
a test engine for controlling the application of said test data to said pattern generator and said result checker, wherein said test engine is programmable to select sequences of test data.

16. The test chip for testing an integrated circuit according to claim 15, wherein said test engine loops through selected test data.

17. The test chip for testing an integrated circuit according to claim 15, wherein said test engine repeats selected test data.

* * * * *